US010063221B1

(12) United States Patent
Trueblood et al.

(10) Patent No.: US 10,063,221 B1
(45) Date of Patent: Aug. 28, 2018

(54) EQUIVALENT TIME SAMPLING

(71) Applicant: Lawrence Livermore National Security, LLC, Livermore, CA (US)

(72) Inventors: Jacob Trueblood, Dublin, CA (US); Brian Matthew Wihl, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 15/789,939

(22) Filed: Oct. 20, 2017

(51) Int. Cl.
*H03K 5/159* (2006.01)
*G01S 7/48* (2006.01)
*G01S 19/07* (2010.01)
*G01S 5/18* (2006.01)

(52) U.S. Cl.
CPC ............... *H03K 5/159* (2013.01); *G01S 5/18* (2013.01); *G01S 19/07* (2013.01)

(58) Field of Classification Search
CPC combination set(s) only.
See application file for complete search history.

(56) References Cited

U.S. PATENT DOCUMENTS 6,466,307 B2 * 10/2002 Chien ................ G01S 7/487
356/5.01
9,797,995 B2 * 10/2017 Gilliland ............... G01S 7/4863

* cited by examiner

*Primary Examiner* — An Luu
(74) *Attorney, Agent, or Firm* — Perkins Coie LLP

(57) ABSTRACT

Equivalent time sampling of a signal may be performed by using an embedded system to create trigger pulses for data acquisition (DAQ) system to record the response. The trigger pulse to the DAQ system may be propagated through digital delay chips controlled by the embedded system. The exemplary embodiments allow the DAQ system to be triggered from locally generated trigger pulses or from external or remote sources.

32 Claims, 10 Drawing Sheets

EQUIVALENT TIME SAMPLING

STATEMENT REGARDING FEDERALLY SPONSORED RESEARCH OR DEVELOPMENT

This invention was made with government support under Contract DE-AC52-07NA27344 awarded by U.S. Department of Energy. The government has certain rights in the invention.

TECHNICAL FIELD

This patent document relates to systems, methods, and devices for equivalent time sampling.

BACKGROUND

Analog signals can be digitized using real-time sampling technology or equivalent time sampling technology. Real-time sampling technology typically samples an entire waveform on each trigger event so that a large number of data points are captured. Real-time sampling can be triggered by an external trigger signal or based on a feature of the data itself such as when waveform's amplitude reaches a certain threshold. Real time sampling is often limited by the sampling rate of the capturing device, as faithful reproduction of the waveform requires a sampling rate that is at least twice the highest frequency of the waveform. For real-time sampling technology, an analog signal is digitized in two stages: discretization and quantization. Discretization is a process of dividing the signal into intervals of time, and each interval is represented by a single measurement of amplitude. During quantization, each amplitude measurement may be approximated by a value from a finite set.

Equivalent time sampling measures the instantaneous amplitude of the waveform at the sampling instant. In contrast to real-time sampling, in conventional equivalent time sampling techniques an input signal is sampled once per trigger, but this process is repeated for each delayed version of the trigger to capture additional samples from the multiple triggers. In particular, the next time a trigger is generated, a small delay is added and another sample is taken. Conventional equivalent time sampling technology uses an external clock to trigger an analog-to-digital converter to acquire a single sample after each transmitted pulse. Such a design causes the performance of the equivalent time sampling system to be limited by the characteristics of the clock.

SUMMARY

Unlike conventional systems, the trigger pulses of the disclosed equivalent time sampling systems are not dependent on a clock, but rather rely on trigger pulses that are generated and controlled by an embedded system to enable data acquisition of a signal. The trigger pulses generated by the embedded system are propagated through delay circuits that are also controlled by the embedded system, and provide a flexible data acquisition capability that can be adjusted to accommodate the needs of the data acquisition system and the characteristics of the captured waveforms. The data acquisition is triggered from either locally generated trigger pulses or from external or remote sources. The embedded system also creates trigger pulses for an external circuit.

In an exemplary embodiment, an equivalent time sampling system is disclosed for capturing digital samples of an input signal without reliance on a reference clock signal. The exemplary equivalent time sampling system comprises an embedded system including a processor and a memory having instructions stored thereupon to generate a first trigger pulse and a second trigger pulse, a transmitter coupled to the embedded system to receive the first trigger pulse and to trigger transmission of an electromagnetic wave to a target, a receiver coupled to the embedded system and configured to receive a time delayed trigger pulse generated at least in-part based on the second trigger pulse and a particular time delay value, the receiver further configured to receive a reflected signal from the target, a delay circuit including a programmable time delay coupled to the embedded system and to the receiver, the delay circuit configured to impart the particular time delay value to the second trigger pulse and to output the time delayed trigger pulse to the receiver based on the programmable time delay.

The instructions stored upon the memory of the embedded system, upon execution by the processor, configure the embedded system to: set a counter to a value indicative of a current number of captured digital signals associated with the signal reflected from the target, upon a determination that the value is not equal to a terminal value, (a) generate the first trigger pulse without relying on any clock signal, (b) generate the second trigger pulse without relying on any clock signal, (c) receive a digital signal representative of the signal reflected from the target, (d) increment the programmable time delay to a new time delay value, (e) adjust the counter value using a predetermined adjustment value, and repeat operations (a) to (e) if the adjusted counter value is not equal to the terminal value.

In some embodiments, the programmable time delay is incremented by adding a predetermined time delay value to a previous programmable time delay. In some embodiments, the predetermined time delay value is 40 picoseconds.

In some embodiments, the digital signal is captured on a falling edge of the time delayed trigger pulse received by the receiver. In some embodiments, the instructions upon execution by the processor further configures the embedded system to store the digital signal.

In some embodiments, the counter value is adjusted by adding the predetermined adjustment value to a previous counter value.

In another exemplary embodiment, a sampling system is disclosed for capturing digital samples of an input signal without reliance on a reference clock signal. The sampling system comprises a plurality of equivalent time sampling systems including a first equivalent time sampling system that comprises: an embedded system including a processor and a memory having instructions stored thereupon to generate a first pulse and a second pulse, a transmitter coupled to the embedded system to receive a first time delayed trigger pulse generated at least in-part based on the first pulse and a first time delay value and to trigger transmission of an electromagnetic wave to a target, a first delay circuit including a first programmable time delay coupled to the embedded system and to the transmitter, the first delay circuit configured to impart the first time delay value to the first pulse and to output the first time delayed trigger pulse to the transmitter based on the first programmable time delay, a receiver coupled to the embedded system and configured to receive a second time delayed trigger pulse generated at least in-part based on the second pulse and a second time delay value, the receiver further configured to receive a reflected signal from the target, a second delay circuit including a second programmable time delay coupled to the embedded system and to the receiver, the second delay circuit configured to impart the second time delay value to the second pulse and to output the second time delayed trigger pulse to the receiver based on the second programmable time delay.

The instructions stored upon the memory of the embedded system, upon execution by the processor, configure the embedded system to: set the first programmable time delay to a transmit delay value; set the second programmable time delay to a receive delay value; set a counter to a value indicative of a current number of captured digital signals associated with the signal reflected from the target; upon determination that the value is not equal to a terminal value, (a) generate the first pulse without relying on any clock signal, (b) generate the second pulse without relying on any clock signal, (c) receive a digital signal representative of the signal reflected from the target, (d) increment the second programmable time delay to a new time delay value, (e) adjust the counter value using a predetermined adjustment value, and repeat operations (a) to (e) if the adjusted counter value is not equal to the terminal value.

In some embodiments, the plurality of equivalent time sampling systems includes a second equivalent time sampling system located further from the first equivalent time sampling system than any other equivalent time sampling system located from the first equivalent time sampling system. In some embodiments, the transmit delay value is a time of flight from the first equivalent time sampling system to the second equivalent time sampling system. In some embodiments, the receive delay value is a time of flight from the first equivalent time sampling system to the second equivalent time sampling system.

In some embodiments, the first equivalent time sampling system comprises a location determination system to determine the time of flight from the first equivalent time sampling system to the second equivalent time sampling system. In some embodiments, the location determination system is an ultrasonic beacon system. In some other embodiments, the location determination system is a differential global positioning system (DGPS).

In some embodiments, the second programmable time delay is incremented by adding a predetermined time delay value to a previous second programmable time delay. In some embodiments, the predetermined time delay value is 40 picoseconds.

In some embodiments, the sampling system further comprises a multiplexer operable to select the second pulse received from the embedded system to output to the second delay circuit, wherein the multiplexer includes a first input electrically coupled to the embedded system to receive the second pulse from the embedded system, a second input electrically coupled to a sensor to optionally receive the second pulse from the sensor, a select input electrically coupled to the embedded system, and an output electrically coupled to the second delay circuit.

In some embodiments, the digital signal is captured on a falling edge of the second time delayed trigger pulse received by the receiver. In some embodiments, the instructions upon execution by the processor further configures the embedded system to store the digital signal. In some embodiments, the counter value is adjusted by adding the predetermined adjustment value to a previous counter value.

In yet another exemplary embodiment, a sampling system is disclosed for capturing digital samples of an input signal without reliance on a reference clock signal. The sampling system comprises a plurality of equivalent time sampling system comprising a first equivalent time sampling system, a second equivalent time sampling system, and a third equivalent time sampling system, wherein the first equivalent time sampling system comprises a transmitter to trigger transmission of an electromagnetic wave to a target, the second equivalent time sampling system and third equivalent time sampling system comprise receivers to receive a reflected signal from the target, the second equivalent time sampling system is located further from the first equivalent time sampling system than the third equivalent time sampling system.

The third equivalent time sampling system comprises an embedded system including a processor and a memory having instructions stored thereupon to select a particular source for a pulse that causes acquisition of data samples, a receiver coupled to the embedded system and configured to receive a time delayed trigger pulse generated at least in-part based on the pulse and a particular time delay value, the receiver further configured to receive the reflected signal from the target, a delay circuit including a programmable time delay coupled to the embedded system and the receiver, the delay circuit configured to impart the particular time delay value to the pulse and to output the time delayed trigger pulse to the receiver based on the programmable time delay, a sensor configured to receive a trigger signal generated by the first equivalent time sampling system without relying on any clock signal, and in response generate an indication to the embedded system to select an output signal of the sensor as the source of the pulse.

Upon receiving the indication from the sensor, the instructions stored upon the memory of the embedded system, upon execution by the processor configure the embedded system to: set the programmable time delay to a receive delay value, set a counter to a value indicative of a current number of captured digital signals associated with the signal reflected from the target, upon determination that the value is not equal to a terminal value, (a) receive a digital signal representative of the signal reflected from the target, (b) increment the programmable time delay to a new delay value, (c) adjust the counter value using a predetermined adjustment value, and repeat operations (a) to (c) if the adjusted counter value is not equal to the terminal value.

In some embodiments, the receive delay value is a time of flight from the first equivalent time sampling system to the third equivalent time sampling system subtracted from a time of flight from the first equivalent time sampling system to the second equivalent time sampling system. In some embodiments, the programmable time delay is incremented by adding a predetermined time delay value to a previous programmable time delay. In some embodiments, the predetermined time delay value is 40 picoseconds.

In some embodiments, the third equivalent time sampling system comprises a location determination system to determine the time of flight from the first equivalent time sampling system to the third equivalent time sampling system and the time of flight from the first equivalent time sampling system to the second equivalent time sampling system. In some embodiments, the location determination system is an ultrasonic beacon system. In some other embodiments, the location determination system is a differential global positioning system (DGPS).

In some embodiments, the sampling system further comprises a multiplexer operable to select the pulse received from the sensor to output to the delay circuit, wherein the multiplexer includes a first input electrically coupled to the embedded system to optionally receive the pulse from the embedded system, a second input electrically coupled to the sensor to receive the pulse from the sensor, a select input electrically coupled to the embedded system, and an output electrically coupled to the delay circuit.

In some embodiments, the sensor includes a photoelectric cell. In some other embodiments, the sensor includes a wireless receiver.

In some embodiments, the digital signal is captured on a falling edge of the time delayed trigger pulse received by the receiver. In some embodiments, the instructions upon execution by the processor further configures the embedded system to store the digital signal.

In some embodiments, the counter value is adjusted by adding the predetermined adjustment value to a previous counter value.

These and other aspects and features are described in greater detail in the drawings, the description and the claims.

DETAILED DESCRIPTION

Figure 1:
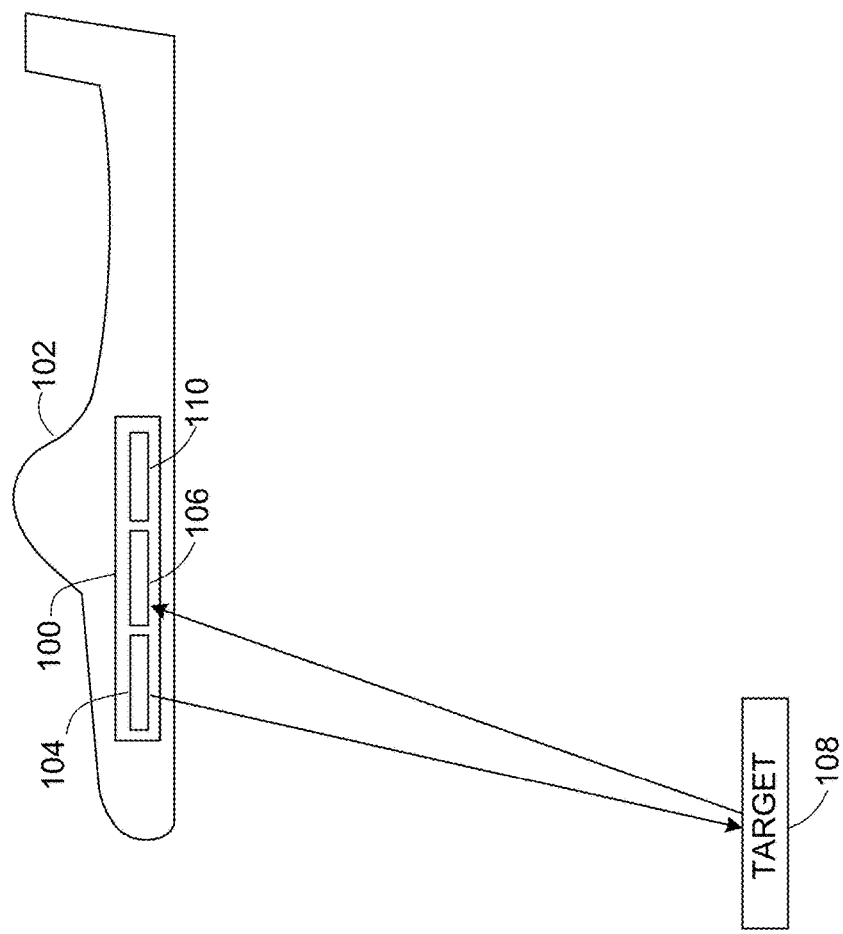
FIG. 1 illustrates an exemplary equivalent time sampling system that is implemented for a drone application.

In this patent document, the word "exemplary" is used to mean serving as an example, instance, or illustration. Any embodiment or design described herein as "exemplary" is not necessarily to be construed as preferred or advantageous over other embodiments or systems. Rather, use of the word exemplary is intended to present concepts in a concrete manner.

A conventional equivalent time sampling system includes an analog to digital converter (ADC) that converts input signals to digital data based on a clock input. The clock input can be delayed using a time-delay circuit. The conventional equivalent time sampling system repeatedly sends a clock input with an time delay to the ADC to sample a waveform at several points. Based on the clock input, the ADC converts the analog signals into digital data and the converted digital signal is stored into memory. Thus, conventional equivalent time sampling systems require an external clock to trigger the ADC. The clock is run at a consistent and constant rate to allow the equivalent time sampling system to capture signals from the ADC. Therefore, a conventional equivalent time system is slave to the speed of the clock.

The disclosed techniques for equivalent time sampling rely on an embedded system that generates pulses or ready signals that are used to trigger a receiver and optionally an external circuit. These pulses are generated without relying on a reference clock. The phrase "embedded system" is used in this patent document to refer to a device or a module within the device that can include other components or subsystems, such as a microcontroller, a processor, FPGA, ASIC, and/or discrete electronic circuits, to produce a trigger signal for data acquisition purposes. As noted above, the embedded system does not use or generate a conventional clock, and in some embodiments can perform various additional operations, such as configuring and/or enabling the delay circuits with produce particular delays, capturing the digital data from the ADC, storing the digital data, controlling a counter or the like.

A benefit of the disclosed equivalent time sampling systems is that the reference clock is removed, thus allowing the overall system clock rate to change based on the ability of the embedded system. The pulses are generated when the embedded system is ready to receive data from the ADC. Another benefit of the disclosed equivalent time sampling systems is the ability to provide a modular implementation, which allows the equivalent time sampling systems to be used for multiple applications. Yet, another benefit of the disclosed equivalent time sampling systems is that they simplify data acquisition (DAQ) system design by not requiring the use of a reference clock. In systems that rely on a reference clock, the remaining components of the equivalent time sampling system are often designed based on, and are limited by, the reference clock and its characteristics. Thus, eliminating the reference clock improves the flexibility of the design which can lead to an improved performance, as well as cost and space savings. Such considerations are especially important for space/cost limited implementations in, for example, systems that are used in drones or unmanned aerial vehicles (UAVs).

In an exemplary embodiment, the equivalent time sampling system is implemented by using an embedded system to create trigger pulses for an external circuit and for DAQ system to record the response. In some embodiments, the trigger pulses are generated by turning the input-output (IO) pins high and back low without relying on a clock. The DAQ system includes a receiver electrically coupled to an analog to digital converter. The trigger pulse to the DAQ system is propagated through digital delay chips that are controlled by the embedded system. The system allows the DAQ system to be triggered from locally generated trigger pulses or from external or remote sources. In some embodiments, the embedded system creates trigger pulses for an external circuit to trigger data acquisition on a remote device. The equivalent time sampling system described in this patent document may be used for several exemplary applications. For example, the equivalent time sampling system may be used in a bi-static antenna, multi-static antenna, or for other applications that may have repetitive signals or require high-speed sampling. The bi-static antenna and multi-static antennas may be used for radar applications.

In some embodiments, the exemplary equivalent time sampling system contains an embedded system and a delay generator board. In some implementations, the equivalent time sampling system operates in two different modes as either a master or a slave.

In the master mode, the equivalent time sampling system generates a trigger pulse and propagates the pulse through a delay path to trigger a DAQ system, such as a receiver electrically coupled to an analog to digital converter, and an external circuit, such as another equivalent time sampling system. The trigger pulse can also be output on an external trigger line so that it can be sent to other equivalent time sampling systems. In some embodiments, the external trigger line can be a wired connection. In some embodiments, the external trigger is sent to another equivalent time sampling system using wireless or optical communication.

In the slave mode, the equivalent time sampling system uses a sensor to trigger the DAQ system, such as a receiver electrically coupled to an analog to digital converter, by sending an interrupt to the embedded system to start the DAQ conversion process. In the slave mode, the embedded system generates no triggers as they are generated externally.

Bi-Static Mode

FIG. 1 illustrates an exemplary equivalent time sampling system 100 used in a drone 102 in a bi-static mode where a transmitter and a receiver are co-located. The equivalent time sampling system includes an embedded system 110, a transmitter 104, and a receiver 106. In some embodiments, the transmitter 104 and receiver 106 are co-located in the same drone 102 or radar device. In some other embodiments, the transmitter and receiver for the equivalent time sampling system may not be co-located. The embedded system 110 generates the trigger pulses for the transmitter 104 and the receiver 106. The transmitter 104 transmits an electromagnetic wave to a target 108 subsequent to receiving a trigger pulse from the embedded system 110. The receiver 106 receives a reflected signal from the target 108. The receiver 106 also receives a trigger pulse from the embedded system 110 to initiate the data acquisition of the reflected signal. For each signal transmitted to a target, a new trigger is sent to the transmitter and the receiver. Thus, the equivalent time sampling system repeats the trigger pulse for the transmitter and the receiver so that the receiver can step through its delays and capture a signal when the transmitter has been triggered. In some embodiments, the first delay for the receiver may be zero seconds. Subsequent delays are added using a predetermined time delay value. The equivalent time sampling system described in this patent document may be used in a bi-static radar, or ground penetrating radar (GPR), or in any device that performs sampling of data.

Figure 2:
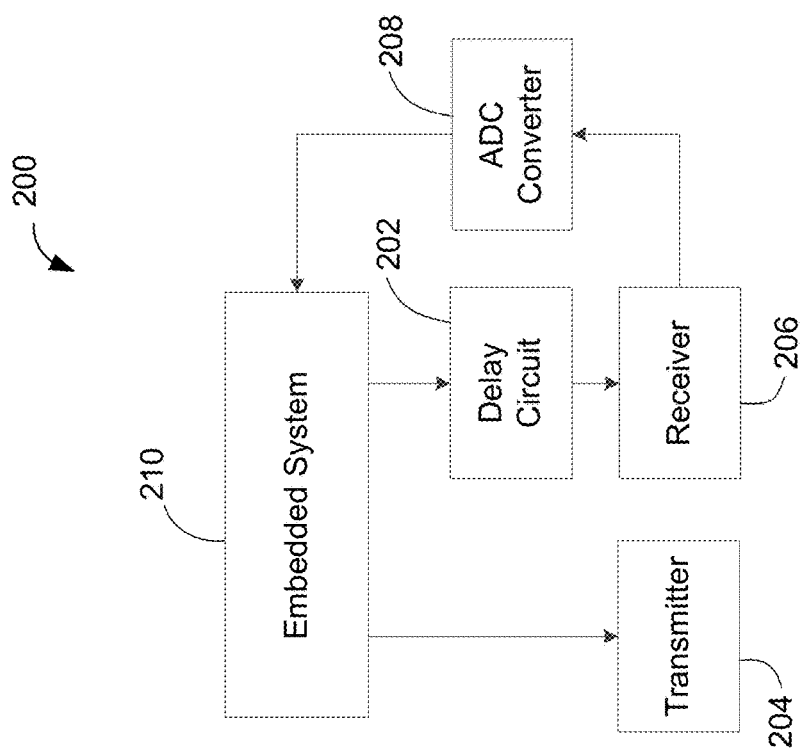
FIG. 2 illustrates a block diagram of an exemplary equivalent time sampling system.

FIG. 2 illustrates a block diagram of an exemplary equivalent time sampling system 200 that may be used in a bi-static mode where the receiver and transmitter are co-located and are controlled by the same embedded system. The equivalent time sampling system 200 includes a transmitter 204 that is electrically coupled to the embedded system 210. The transmitter 204 is configured to receive a first trigger pulse from the embedded system 210. The transmitter 204 transmits an electromagnetic wave to a target (not shown) subsequent to receiving a trigger pulse from the embedded system 210. The equivalent time sampling system 200 also includes a receiver 206 that is electrically coupled to the embedded system 210 through a delay circuit 202. The receiver 206 is configured to receive a time delayed trigger pulse from the delay circuit 202. The receiver 206 receives a reflected signal from the target subsequent to receiving the time delayed trigger pulse from the delay circuit 202. In some embodiments, the embedded system 210 generates separate trigger signals for the transmitter 204 and the delay circuit 202. In such an embodiment, the two trigger signals may be sent to the transmitter 204 and the delay circuit 202 at the same time. A benefit of having separate trigger signals is that it allows the equivalent time sampling system 200 to be used in other modes where a receiver can be triggered separately from the transmitter. In some other embodiments, the embedded system generates one trigger signal that propagates to both the transmitter 204 and the delay circuit 202.

The delay circuit 202 is electrically coupled to the embedded system 210 and to the receiver 206. The delay circuit 202 can include a programmable time delay that is adjusted by the embedded system 210. In some embodiments, the time delays needed to create the time stepping for equivalent time sampling is done by using three digital delay chips wired in series. In some example implementations, each digital delay chip, or delay circuit, is configured to provide 5 ps steps over a 10 ns of sweep time resulting in a total sweep time over 30 ns and a cycle-to-cycle jitter of bps. A 10 ns sweep time is the time over which the signal is sampled with 5 ps between the samples. The delay chips or delay circuits may be programmed through the embedded system's general purpose input/output (GPIO).

The delay circuit 202 is configured to receive a second trigger pulse from the embedded system 210 and to output the time delayed trigger pulse to the receiver 206 based on the programmable time delay. In some embodiments, a second delay circuit with a programmable time delay is located in between the embedded system 210 and the transmitter 204 (not shown in FIG. 2). In some implementations, the programmable time delay of the second delay circuit may be initially set to zero if, for example, the equivalent time sampling system of FIG. 1 is used with a co-located transmitter and receiver. In other implementations, such as for multi-static master transmitter mode, the programmable delay may be set to a non-zero value to account for the time of flight to the farthest drone.

The equivalent time sampling system 200 also includes an analog to digital converter (ADC) 208 configured to convert the reflected signal received by the receiver 206 to a digital signal. The ADC 208 is electrically coupled to the embedded system 210 and to the receiver 206. In some embodiments, when a receiver 206 receives a time delayed trigger pulse, the receiver 206 sends the received reflected signal to the analog to digital converter. The exemplary features of the embedded system 210 are further described in FIG. 3.

Figure 3:
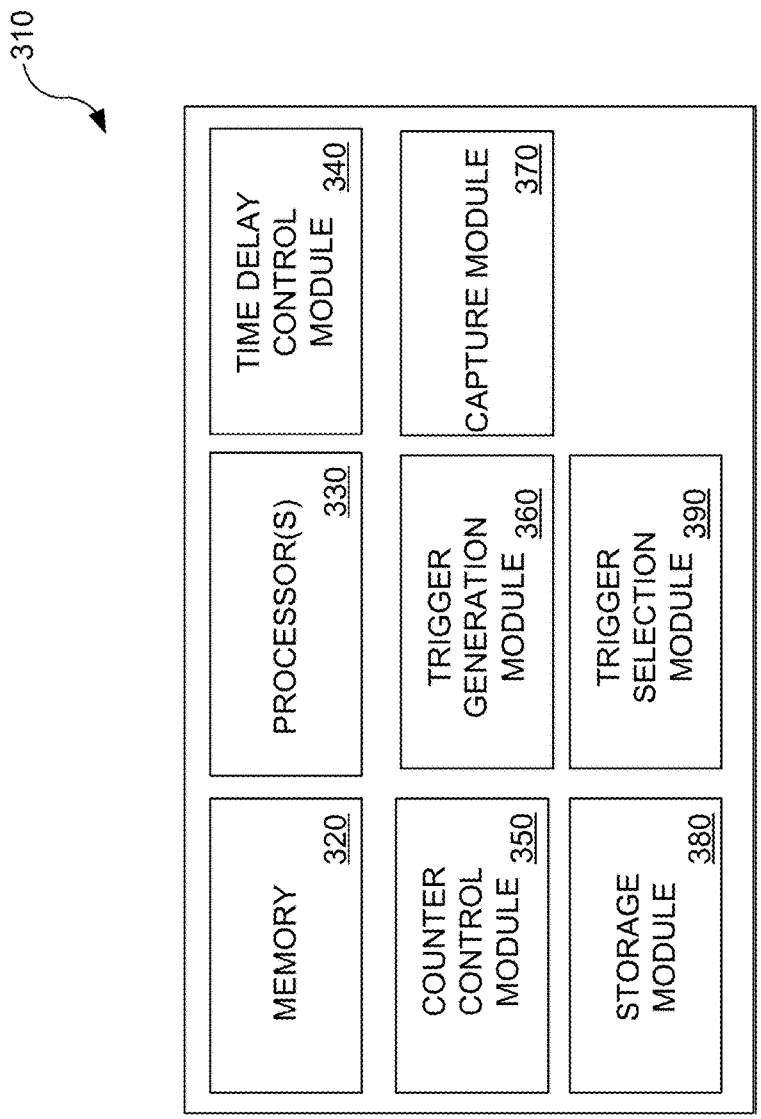
FIG. 3 illustrates a block diagram of an exemplary embedded system for an equivalent time sampling system.

FIG. 3 illustrates a block diagram of an exemplary embedded system 310 for the equivalent time sampling system that may be used for the bi-static mode or the multi-static mode. In a bi-static mode, the receiver and transmitter are co-located and are controlled by the same embedded system. In a multi-static mode, multiple equivalent time sampling systems operates simultaneously where the overall system includes one transmitter and multiple receivers. The embedded system 310 includes at least one processor 330 and a memory 320 having instructions stored thereupon. The instructions upon execution by the processor 330 configure the embedded system 310 to perform several operations using the various modules. In some embodiments, the embedded system 310 may be implemented using an FPGA, an ASIC, and/or discrete electronic circuits. In an exemplary embodiment, the embedded system may be implemented on a Raspberry Pi computer or on an ARM board.

The embedded system 310 includes a time delay control module 340. The time delay control module 340 sets the programmable time delay of the delay circuit. In some embodiments, the time delay control modules 340 sets the programmable time delays for the delay circuits associated with both the transmitter and the receiver. To repeat certain sampling operations, the time delay control module 340 can increment the programmable time delay for the delay circuit so that when a transmitter is triggered, the receiver can receive a reflected signal at an incremented time delay value.

In some embodiments, the programmable time delay is incremented by adding a predetermined time delay value to a previous programmable time delay. In some embodiments, the predetermined time delay value is about 40 picoseconds. In some embodiments, the predetermined time delay value is about 35 picoseconds.

Figure 4:
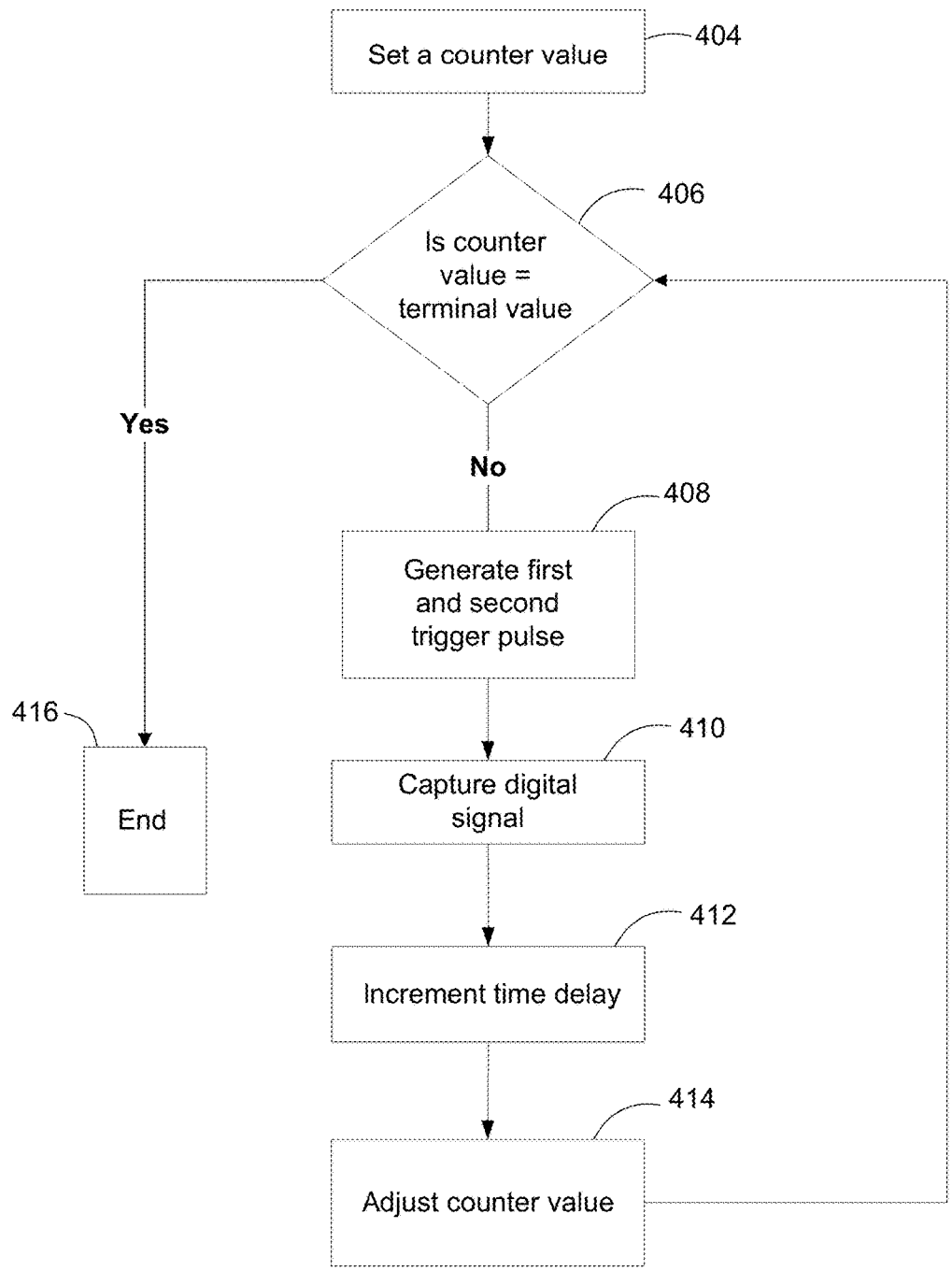
FIG. 4 illustrates a flow diagram for the timing operations and the capture of signals by an exemplary embedded system operating in a bi-static mode.

The embedded system 320 also includes a counter control module 350 that manages a counter that is used to repeat certain operations for the embedded system 320 as further explained in FIG. 4. The counter control module 350 stores a counter value associated with a number of digital signals captured by the embedded system 310 from the analog to digital converter. In some embodiments, the total number of digital signals captured is one of 256 samples, 512 samples, or 766 samples. The counter control module 350 sets the counter to an initial value, where the initial value is not equal to a terminal value. When the counter control module 350 determines that the counter value is not equal to the terminal value, the counter control module 350 allows the embedded system 310 to perform certain operations related to the trigger time delay control module 340, generation module 360, capture module 370, and storage module 380. The counter control module 350 also adjusts the counter value using a predetermined adjustment value.

The trigger generation module 360 generates trigger pulses for the transmitter and the receiver. For example, the trigger generation module 360 generates the first trigger pulse for the transmitter. The trigger generation module 360 also generates the second trigger pulse for the delay circuit to output the time delayed trigger pulse to the receiver. In some embodiments, the first and the second trigger pulse generated by the embedded system are sent at the same time.

The capture module 370 captures the digital signal from the analog to digital converter. In some embodiments, the digital signal is captured on a falling edge of the time delayed trigger pulse received by the receiver. In some other embodiments, the digital signal can be captured on the rising edge of the time delayed trigger pulse.

The embedded system 310 also includes a storage module 380. The storage module 380 stores in a memory the digital signal captured from the analog to digital converter.

Figure 6:
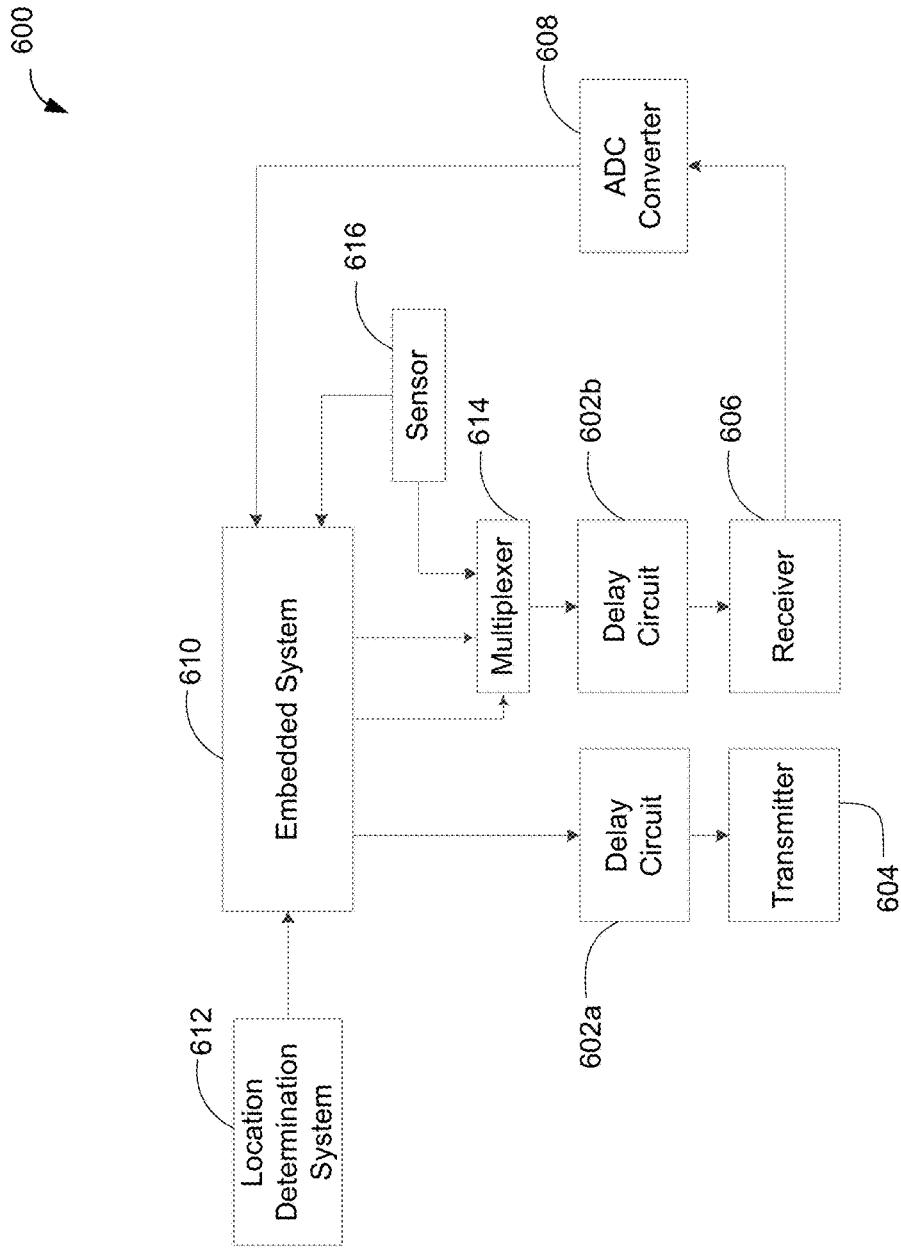
FIG. 6 illustrates another exemplary equivalent time sampling system for the multi-static mode.

The trigger selection module 390 generates a selection signal so that the receiver receives either the pulse generated by the embedded system or the pulse sent by a sensor. As shown in FIG. 6, in some implementations, the trigger selection module 390 controls the select input of the multiplexer 614 to select either the embedded system 610 or the sensor 616 as the source of the pulse for the receiver. As further described in FIG. 6, in some embodiments, the embedded system is preset to generate the triggers for the receiver unless it receives an interrupt from the sensor. In some other embodiments, the embedded system may dynamically choose between the embedded system and the sensor as the source of the trigger for the receiver. In an exemplary embodiment, a network coordinator or network controller can instruct each embedded system whether it is going to be transmitter or a receiver. In some embodiments, the network coordinator can wirelessly instruct each embedded system with a mode of operation, such as bi-static mode, multi-static master transmitter mode, or multi-static slave receiver mode. If the embedded system is setup as a receiver, it will trigger from the sensor input.

As further explained in this patent document, in some embodiments, the trigger selection module 390 selects the embedded system to generate the pulse for the receiver when the equivalent time sampling system is operating in a master transmitter mode. In some other embodiments, the trigger selection module 390 selects the sensor to send the pulse for the receiver when the sensor sends an interrupt to the embedded system, for example, when the equivalent time sampling system is operating in a slave receiver mode.

FIG. 4 illustrates a flow diagram for the timing operation and capture of signals by an exemplary embedded system operating in a bi-static mode. At operation 404, the embedded system sets the counter value to an initial value that is not equal to a terminal value. At operation 406, the embedded system determines whether the counter value is equal to a terminal value. In some embodiments, the terminal value is selected based on the number of samples, for example, 256 samples, 512 samples, or 766 samples. If the counter value is not equal to the terminal value, then the embedded system performs operation 408 by generating the first trigger pulse for the transmitter and the second trigger pulse for the receiver. The second trigger pulse is sent to the delay circuit to output the time delayed trigger pulse to the receiver. In some embodiments, the first and the second trigger pulse generated by the embedded system are sent at the same time. The first trigger pulse and the second trigger pulse are generated without relying on any clock signal.

At operation 410, the embedded system captures the digital signal from the analog to digital converter. In some embodiments, the digital signal is captured on a falling edge of the time delayed trigger pulse received by the receiver.

At operation 412, the embedded system increments the programmable time delay. At operation 414, the embedded system adjusts the counter value using a predetermined adjustment value. In some embodiments, the counter value is adjusted by adding the predetermined adjustment value to a previous counter value. For example, the counter value is set to an initial value of 1, the counter value is incremented by a predetermined value of 1, and the terminal value is set at 512. In such an example, the counter control module 350 allows the embedded system to repeat certain operations by the various modules until the counter value equals 512. In some embodiments, the counter value is adjusted by subtracting the predetermined adjustment value from the previous counter value. For example, the counter value is set to an initial value of 512, the counter value is decremented by a predetermined value of 1, and the terminal value is set at 1. In such an example, the counter control module 350 allows the embedded system to repeat certain operations by the various modules until the counter value equals 1.

The embedded system may return to operation 406 after operation 414. In some embodiments, after operation 414 and before returning to operation 406, the embedded system stores the digital signal.

If the embedded system determines that the counter value is equal to the terminal value, then the process ends 416. In some embodiments, if the counter value is equal to the terminal value, the embedded system may start again at operation 404.

Figure 9:
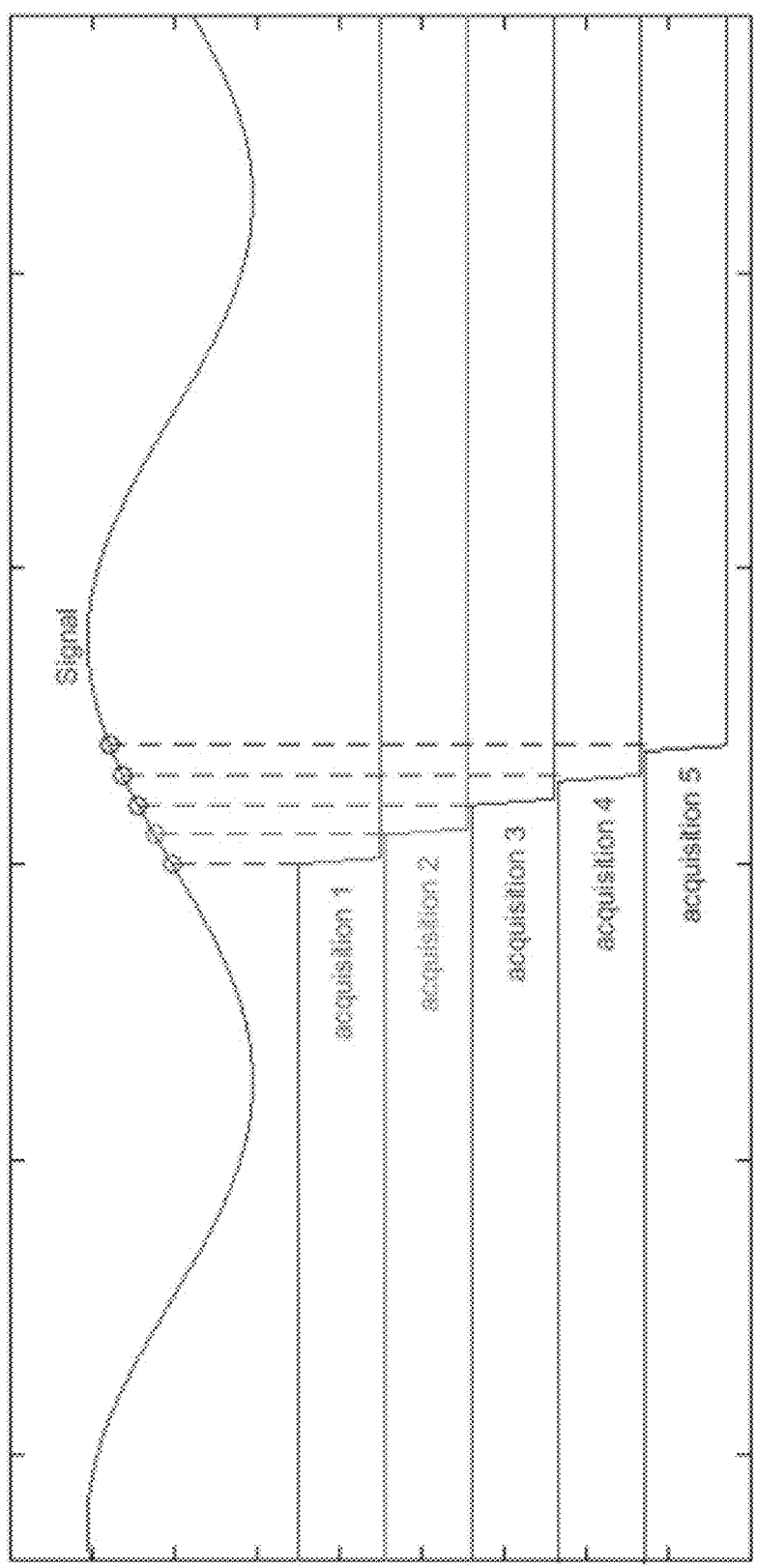
FIG. 9 illustrates acquisitions performed by the exemplary equivalent time sampling system.

FIG. 9 illustrates acquisitions performed by the exemplary equivalent time sampling system. The circles on the signal show the location of where the ADC acquired the signal based on a trigger signal, such as a pulse. In some embodiments, each acquisition is delayed by a predetermined time delay value, for example, 35 ps or 40 ps, from the previous acquisition.

Figure 5:
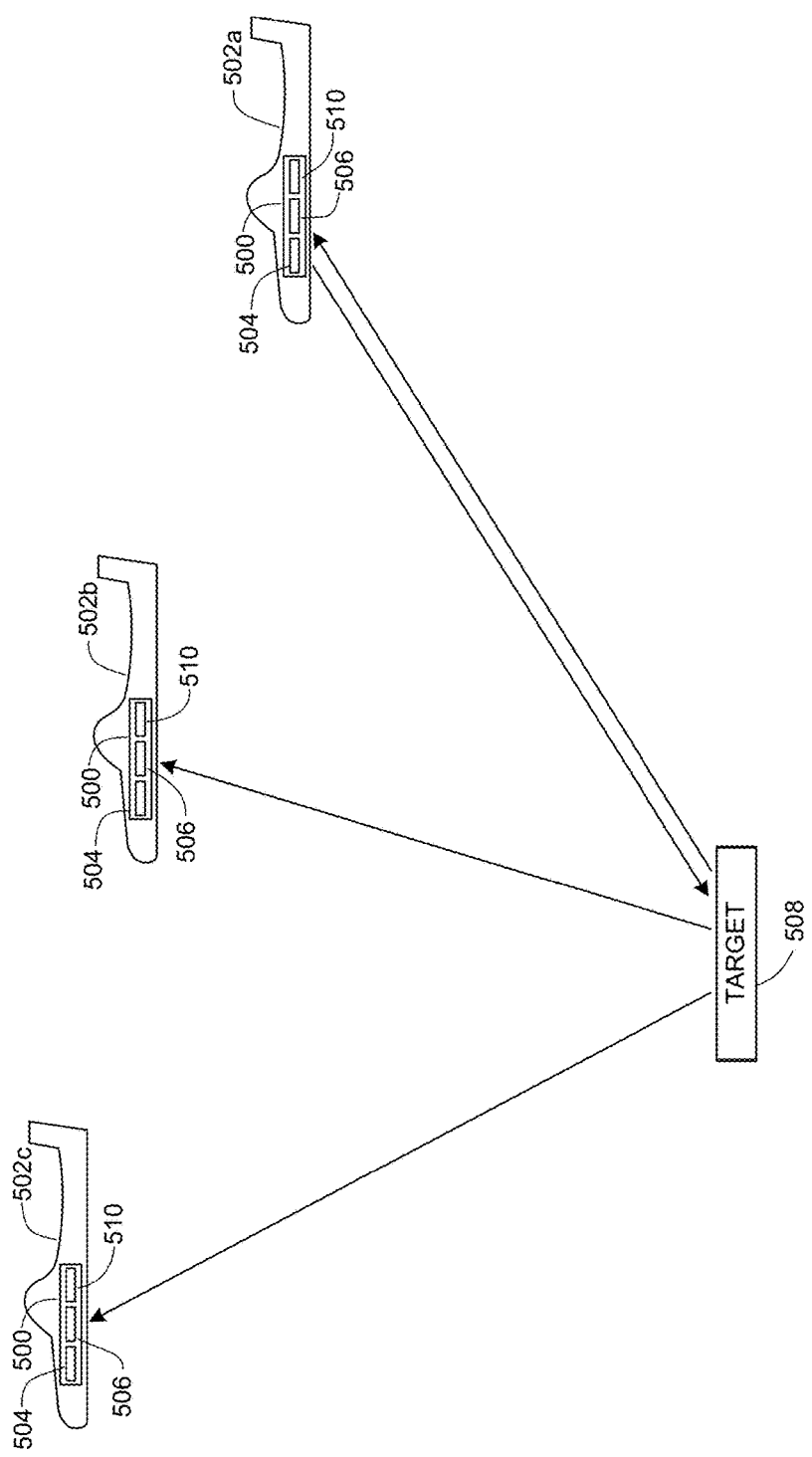
FIG. 5 illustrates another exemplary equivalent time sampling system that is implemented for a multiple drone application.

FIG. 5 illustrates another exemplary equivalent time sampling system 500 that is used in, for example, multiple drones 502a-502c. Each drone 502a-502c includes an exemplary equivalent time sampling system 500 that includes a transmitter 504, a receiver 506, and an embedded system 510. Each drone includes an equivalent time sampling system 500. In some embodiments, a transmitter in a first drone 502a transmits an electromagnetic wave subsequent to receiving a trigger pulse from the embedded system in the first drone 502a. The receivers 504 in each drone 502a-502c receive a reflected signal subsequent to receiving a trigger pulse generated by the embedded system of the first drone 502a. The embedded system of the first drone 502a generates the trigger pulses for the transmitter of the first drone 502a. The embedded system of the first drone 502a also generates the trigger pulses for the receivers of each drone 502a-502c, and communicates those pulses to the receivers 506 on each drone 502a-502c. In some embodiments, the exemplary equivalent time sampling system of FIG. 5 can be used for multi-static radar application.

Multi-Static Master Transmitter Mode

In an exemplary embodiment, as shown in FIG. 5, a sampling system includes a plurality of equivalent time sampling systems 500 that operate in a master transmitter mode or a slave receiver mode. In one implementation, the plurality of equivalent time sampling system includes a first equivalent time sampling system in a drone 502a, and a second equivalent time sampling system in drone 502c that is located farthest from the first equivalent time sampling system of drone 502a. Each of the additional drones in the system may also include an associate equivalent time sampling system. Each exemplary equivalent time sampling system 500 is further described in FIG. 6.

FIG. 6 illustrates another exemplary equivalent time sampling system 600 for the multi-static mode. In a multi-static mode, multiple equivalent time sampling system operates simultaneously where the overall system includes one transmitter and multiple receivers. The exemplary equivalent time sampling system 600 may be used in a master transmitter mode or in a slave receiver mode. For example, referring to FIG. 5, the equivalent time sampling system in drone 502a may act as a master transmitter, and the equivalent time sampling system in drone 502b-502c may act as slave receivers. In the master transmitter mode, the equivalent time sampling system in drone 502a may also receive and process the reflected signals received by the receiver in drone 502a.

Referring to FIG. 6, the exemplary equivalent time sampling system 600 includes a transmitter 604 configured to receive a first time delayed trigger pulse to transmit an electromagnetic wave to a target. A first delay circuit 602a is electrically coupled to a transmitter 604 and to the embedded system 610. The first delay circuit 602a includes a first programmable time delay. The first delay circuit 602a is configured to receive a first pulse from the embedded system 610 and to output the first time delayed trigger pulse to the transmitter 604 based on the first programmable time delay. In a multi-static mode, the trigger pulse to the master transmitter is delayed using the first delay circuit 602a to account for the drone located farthest from the master transmitter to receive a reflected signal.

The exemplary equivalent time sampling system 600 also includes a receiver 606 configured to receive a second time delayed trigger pulse to enable or trigger the capture of the reflected signal from the target. A second delay circuit 602b is electrically coupled to the receiver 606 and to a multiplexer 614. The second delay circuit 602b includes a second programmable time delay and is configured to receive a second pulse from the multiplexer 614 and to output the second time delayed trigger pulse to the receiver 606 based on the second programmable time delay. In a multi-static mode, the trigger pulse to the receiver is delayed using the second delay circuit 602b to allow all the receivers in the system to both receive the reflected signal and to increment the delays. In some embodiments, the embedded system 610 generates separate trigger signals for the delay circuits 602a and 602b. In such an embodiment, the two trigger signals sent to the delay circuits 602a and 602b may be sent at the same time. In some other embodiments, the embedded system generates one trigger signal that propagates to both delay circuits 602a and 602b.

The multiplexer 614 is operable to select the second pulse received from the embedded system to output to the second delay circuit. The multiplexer 614 includes a first input electrically coupled to the embedded system 610 to receive the second pulse from the embedded system. The second input of the multiplexer 614 is electrically coupled to a sensor 616 to optionally receive the second pulse from the sensor. When a receiver operates in a slave mode, the sensor 616 receives a trigger pulse generated by a remote master transmitter. Subsequent to receiving the trigger pulse, the sensor 616 generates the pulse for the receiver operating in the slave mode. The select input of the multiplexer 614 is electrically coupled to the embedded system 610. In some embodiments, the embedded system 610 is preset to generate the triggers for the receiver unless it receives an interrupt from the sensor 616. Thus, the embedded system 610 may default to setting the input of the multiplexer 614 so that the embedded system 610 is the source of the trigger pulse unless an interrupt is received from the sensor 616. In some other embodiments, the embedded system 610 may dynamically set the select input of the multiplexer 614 based on the master or the slave operating mode of the drone. The output of the multiplexer 614 is electrically coupled to the second delay circuit 602b. In some embodiments, the sensor 616 includes a photoelectric cell. In some embodiments, the sensor 616 may include a wireless receiver configured to receive a radio frequency (RF) signal and to generate an output that is provided to the embedded system 610. The RF signal can be fully or partially encrypted, and can provide indications to the embedded system as the source of the trigger signal.

An analog to digital converter (ADC) 608 is configured to convert the reflected signal received by the receiver to a digital signal. The ADC 608 is electrically coupled to the embedded system 610 and to the receiver 606. In some embodiments, when a receiver 606 receives a time delayed trigger pulse, the receiver 606 sends the received reflected signal to the analog to digital converter.

The equivalent time sampling system also includes a location determination system 612 that allows the system to determine the time of flight from the first equivalent time sampling system in drone 502a to the second equivalent time sampling system in drone 502c. The time of flight information is relevant for a multi-static mode where multiple equivalent time sampling systems operate simultaneously to allow a master transmitter to transmit a signal and to allow multiple receivers to receive the reflected signal. The time of flight information is used to delay the trigger pulses for the transmitter and the receiver based on whether the system is operating in a multi-static master transmitter mode or in a multi-static slave receiver mode. In a multi-static master transmitter mode, an embedded system programs the delay circuits of the co-located transmitter and receiver to include a time of flight to the farthest equivalent time sampling system in the sampling system. In a multi-static slave receiver mode, the embedded system can program the delay circuit of the transmitter to zero, and the embedded system programs the delay circuit of the co-located receiver to include a first time of flight subtracted from a second time of flight. The first time of flight is the time of flight from the drone to the master transmitter drone. The second time of flight is the time of flight from the farthest drone to the drone that includes the master transmitter.

Some examples of the location determination system 612 include an ultrasonic beacon system and a Differential Global Positioning System (DGPS). The ultrasonic beacon system uses sound waves with frequencies higher than the upper audible limit of human hearing to calculate time of flight between the equivalent time sampling systems operating in multi-static mode. For example, an ultrasonic beacon system can calculate the distance between each of the equivalent time sampling systems located on, for example, different drones, and calculate the time of flight by dividing distance by speed. Thus, for example, referring to FIG. 5, the equivalent time sampling system of drone 502b can determine the time of flight between the equivalent time sampling systems of drones 502 and 502c. And, the equivalent time sampling system of drone 502b can determine the time of flight between itself and the equivalent time sampling system of drone 502a. The ultrasonic beacon system may give a location accuracy of ±1 centimeter (cm). The distance information and the time of travel of a light wave or any type of electromagnetic wave through air can be known. Thus, the location determination system 612 determines the time of flight by determining the location of the various equivalent time sampling system included in, for example, drones.

For example, for ground penetrating radar (GPR), the propagation delay between trigger sources, such as the master transmitter, and remote DAQ system, such as a slave receiver and associated ADC, is determined by using a location determination system 612 to calculate time-of-flight for wireless applications with high accuracy. For wired applications, such as for bi-static mode where the transmitter and receiver are co-located, the delay of the cables can be measured or a calibration can be performed to determine path delay. The delays may be programmed into the embedded systems.

FIG. 6 also includes an embedded system 610, which was previously described in connection with FIG. 3. The embedded system 610 includes at least one processor and a memory having instructions stored thereupon. The instructions upon execution by the processor configure the embedded system 610 to perform the operations as described in FIG. 7.

Figure 7:
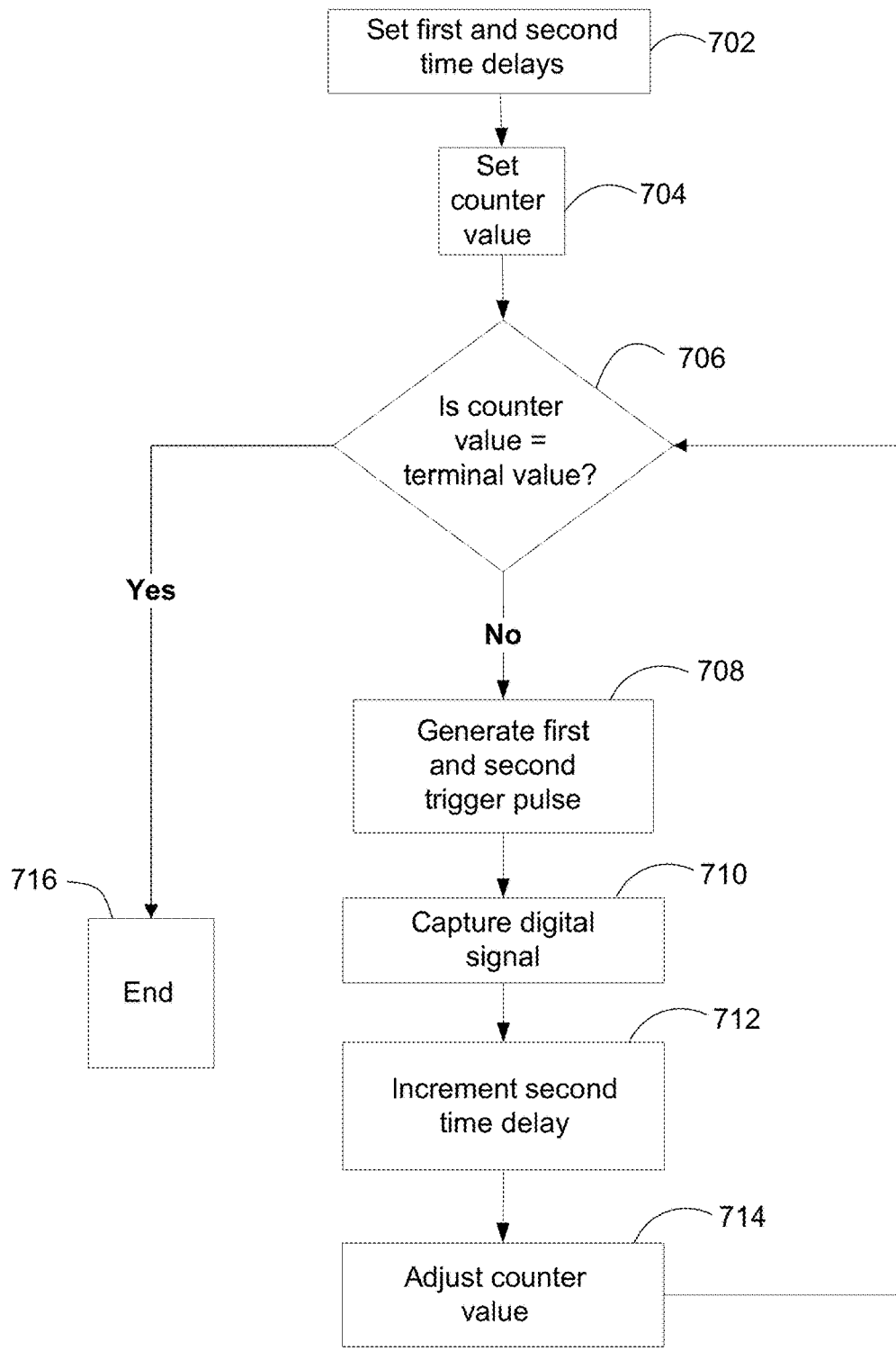
FIG. 7 illustrates a flowchart for the timing operations and capture of signals by an exemplary embedded system operating in a multi-static master transmitter mode.

FIG. 7 illustrates a flowchart for the timing operations and capture of signals by an exemplary embedded system operating in a multi-static master transmitter mode. As explained in this patent document, referring to FIG. 5, the equivalent time sampling system in drone 502a may act as a master transmitter, and the equivalent time sampling system in drone 502b-502c may act as slave receivers. In the master transmitter mode, the equivalent time sampling system in drone 502a may also receive and process the reflected signals received by the receiver in drone 502a. The flowchart of FIG. 7 is performed in the embedded system of drone 502a operating in the master transmitter mode.

Referring to FIG. 7, at operation 702, the embedded system 610 sets the first programmable time delay to a transmit delay value. Referring to FIG. 5, the transmit delay value is a time of flight from the first equivalent time sampling system in a first drone 502a to the second equivalent time sampling system in a second drone 502c located farthest from the first equivalent time sampling system in the first drone 502a. Returning to FIG. 7, at operation 702, the embedded system 610 also sets the second programmable time delay to a receive delay value. In some embodiments, the receive delay value is a time of flight from the first equivalent time sampling system to the second equivalent time sampling system located farthest from the first equivalent time sampling system. The time of flight information is determined by the location determination system.

At operation 704, the embedded system 610 sets a counter to an initial value that is not equal to a terminal value. The counter stores a value for a number of digital signals captured by the embedded system from the analog to digital converter.

At operation 706, the embedded system determines whether the counter value is equal to the terminal value. If the counter value is not equal to the terminal value, then at operation 708, the embedded system generate the first pulse for the first delay circuit to output the first time delayed trigger pulse to the transmitter. The embedded system also generates the second pulse for the second delay circuit to output the second time delayed trigger pulse to the receiver. The first pulse and the second pulse are generated without relying on any clock signal.

At operation 710, the embedded system captures the digital signal from the analog to digital converter. In some embodiments, the digital signal is captured on a falling edge of the second time delayed trigger pulse received by the receiver.

At operation 712, the embedded system increments the second programmable time delay. In some embodiments, the second programmable time delay is incremented by adding a predetermined time delay value to a previous second programmable time delay. In some embodiments, the predetermined time delay value is about 40 picoseconds. In some embodiments, the predetermined time delay value is about 35 picoseconds.

At operation 714, the embedded system adjusts the counter value using a predetermined adjustment value. In some embodiments, the counter value may be adjusted by adding the predetermined adjustment value to a previous counter value. In some embodiments, the counter value may be adjusted by subtracting the predetermined adjustment value from the previous counter value.

The embedded system may return to operation 706 after operation 714. In some embodiments, after operation 714 and before returning to operation 706, the embedded system may store the digital signal.

If the embedded system determines that the counter value is equal to the terminal value, then the process ends 716. In some embodiments, if the counter value is equal to the terminal value, the embedded system may start again at operation 702.

Multi-Static Slave Receiver Mode

Referring to FIG. 5, the equivalent time sampling system in drone 502a may act as a master transmitter, and the equivalent time sampling system in drone 502b-502c may act as slave receivers. Each drone includes an equivalent time sampling system 500. In some embodiments, the equivalent time sampling systems operating in the slave receiver mode, such as for drones 502b and 502c, do not use their transmitters.

In some embodiments, an equivalent time sampling system includes a plurality of equivalent time sampling system. In one implementation, the plurality of equivalent time sampling system includes a first equivalent time sampling system located in drone 502a, a second equivalent time sampling system located in drone 502c, and a third equivalent time sampling system located in drone 502b. The second equivalent time sampling system in drone 502c is located farthest from the first equivalent time sampling system located in drone 502*a*. The first equivalent time sampling system comprises a transmitter 504 configured to transmit an electromagnetic wave to a target 508. The second and third equivalent time sampling systems receive a reflected signal from the target 508. Each exemplary equivalent time sampling system is described in FIG. 6.

Referring to FIG. 6, the second equivalent time sampling system comprises a receiver 606 configured to receive a time delayed trigger pulse to receive the reflected signal from the target. A delay circuit 602*b* is electrically coupled to the receiver 606 and to a multiplexer 614. A delay circuit 602*b* includes a programmable time delay. The delay circuit 602*b* is configured to receive a pulse from the multiplexer 614 and to output the time delayed trigger pulse to the receiver 606 based on the programmable time delay.

The multiplexer 614 is operable to select the pulse received from a sensor 616 to output to the delay circuit. The multiplexer 614 includes a first input electrically coupled to the embedded system to optionally receive the pulse from the embedded system 610. The second input of the multiplexer 614 is electrically coupled to the sensor 616 to receive the pulse from the sensor. The select input of the multiplexer 614 is electrically coupled to the embedded system 610. The output of the multiplexer 614 is electrically coupled to the delay circuit 602*b*.

A sensor 616 is configured to receive a trigger signal. In some embodiments, the sensor 616 receives a trigger signal, such as light, from system operating in the master transmitter mode. The sensor 616 may also transmit a trigger signal using, for example, a laser, a radio device, or the like. When the remote sensor receives the trigger signal from the embedded system of the master transmitter, the sensor is configured to output the pulse to the delay circuit and to generate an interrupt. The sensor 616 is electrically coupled to the embedded system 610 to send the interrupt to the embedded system. In some embodiments, the sensor 616 includes a photoelectric cell. In some embodiments, the sensor 616 may include a wireless receiver.

An ADC 608 is configured to convert the reflected signal received by the receiver to a digital signal. The ADC 608 is electrically coupled to the embedded system 610 and to the receiver 606. In some embodiments, when a receiver 606 receives a time delayed trigger pulse, the receiver 606 sends the received reflected signal to the analog to digital converter.

As discussed in this patent document, the equivalent time sampling systems includes a location determination system 612 configured to determine the time of flight between the first, the second, and the third equivalent time sampling systems. For example, the third equivalent time sampling system in drone 502*b* determines the time of flight from the first equivalent time sampling system to the third equivalent time sampling system and the time of flight from the first equivalent time sampling system to the second equivalent time sampling system.

The exemplary features of the embedded system 610 are also described in FIG. 3. The embedded system 610 including at least one processor and a memory having instructions stored thereupon. The instructions upon execution by the processor configure the embedded system to receive the interrupt from the sensor to perform certain operations. The embedded system 610, in response to receiving the interrupt from the sensor, performs the operations described in FIG. 8.

Figure 8:
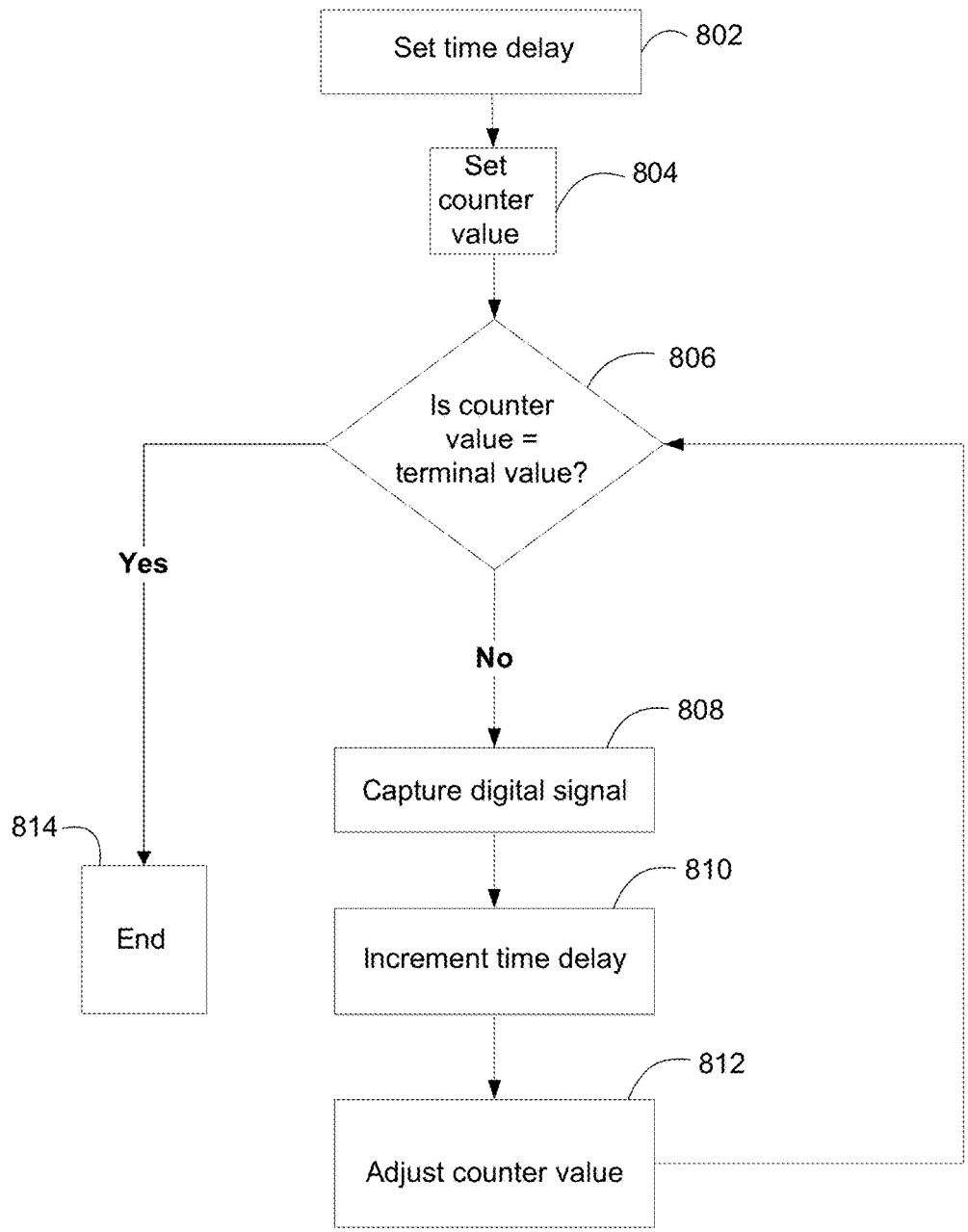
FIG. 8 illustrates a flowchart for the timing operations and capture of signals by an exemplary embedded system operating in a multi-static slave receiver mode.

FIG. 8 illustrates a flowchart for the timing operations and capture of signals by an exemplary embedded system operating in a multi-static slave receiver mode. The operations of FIG. 8 are triggered based on receiving an interrupt from a sensor. For example, referring to FIG. 5, when the sensor located in the embedded system of drone 502*b* receives a trigger signal from the embedded system of drone 502*a*, the sensor generates an interrupt for the embedded system of drone 502*b* to perform the operations of FIG. 8. The trigger signal is generated by the embedded system of drone 502*a* without relying on any clock signal. Returning to FIG. 8, at operation 802, the embedded system sets the programmable time delay to a receive delay value. In some embodiments, the receive delay value is a time of flight from the first equivalent time sampling system in drone 502*a* to the third equivalent time sampling system in drone 502*b* subtracted from a time of flight from the first equivalent time sampling system in drone 502*a* to the second equivalent time sampling system in drone 502*c* located farthest from the first equivalent time sampling system in drone 502*a*. The time of flight information is determined by the location determination system.

At operation 804, the embedded system sets a counter to an initial value that is not equal to a terminal value. The counter stores a value for a number of digital signals captured by the embedded system from the analog to digital converter.

At operation 806, the embedded system determines whether the counter value is equal to the terminal value. If the counter value is not equal to the terminal value, then at operation 808, the embedded system captures the digital signal from the analog to digital converter. In some embodiments, the digital signal is captured on a falling edge of the time delayed trigger pulse received by the receiver.

At operation 810, the embedded system increments the programmable time delay. In some embodiments, the programmable time delay is incremented by adding a predetermined time delay value to a previous programmable time delay. In some embodiments, the predetermined time delay value is about 40 picoseconds. In some embodiments, the predetermined time delay value is about 35 picoseconds.

At operation 812, the embedded system adjusts the counter value using a predetermined adjustment value. In some embodiments, the counter value may be adjusted by adding the predetermined adjustment value to a previous counter value. In some embodiments, the counter value may be adjusted by subtracting the predetermined adjustment value from the previous counter value.

The embedded system may return to operation 806 after operation 812. In some embodiments, after operation 812 and before returning to operation 806, the embedded system may store the digital signal.

If the embedded system determines that the counter value is equal to the terminal value, then the process ends 814. In some embodiments, if the counter value is equal to the terminal value, the embedded system may start again at operation 802.

Figure 10:
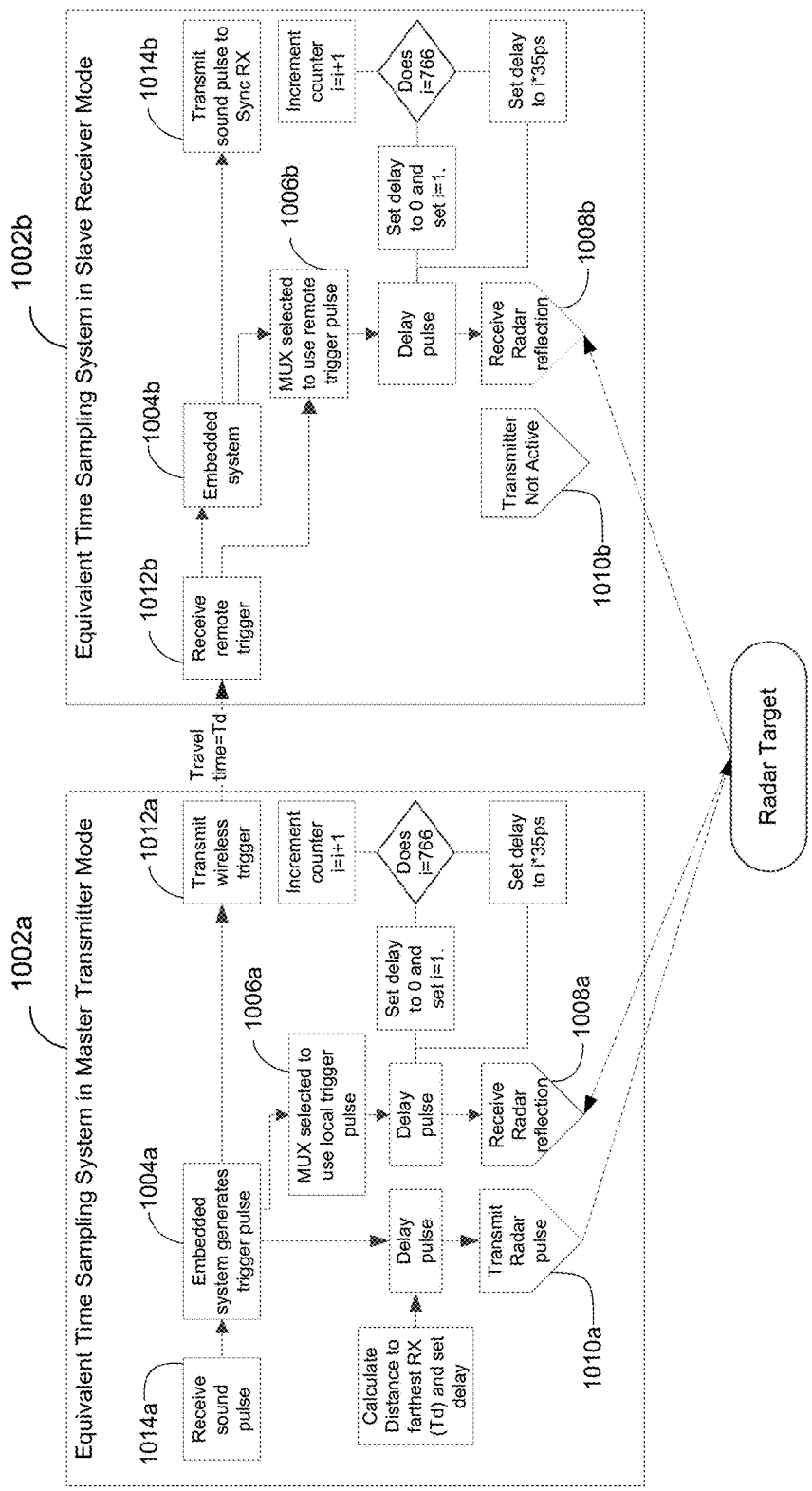
FIG. 10 illustrates two radar systems utilizing an exemplary equivalent time sampling system in a multi-static master and slave modes.

FIG. 10 illustrates an implementation of the equivalent time sampling system in the multi-static master and slave modes on two radars. In the first radar (left hand side of FIG. 10), the equivalent time sampling system 1002*a* is operating in the multi-static master transmitter mode. In the second radar (right hand side of FIG. 10), the equivalent time sampling system 1002*b* is operating in the multi-static slave receiver mode. The multiplexer 1006*a* in the first radar is set by the embedded system 1004*a* to select the embedded system 1004*a* as the source of the trigger pulses for the receiver 1008*a*. In the second radar, the multiplexer 1006*b* is set by the embedded system 1004*b* to select a trigger from a sensor 1012b. The sensor 1012b of the second radar sends an interrupt to the embedded system 1004b when the sensor 1012b receives a trigger signal transmitted by the sensor 1012a of the first radar.

For the first radar, the delay for the transmitter 1010a is set to the time of flight or the wireless signal travel time (Td) from the first radar to the second radar. In the implementation of FIG. 10, the time of flight information is determined based on an ultrasonic beacon 1014b that transmits sound pulses from the second radar to an ultrasonic beacon system 1014a of the first radar. Based on the distance travelled by the sound pulse, the embedded system 1004a of the first radar can calculate the distance to the farthest receiver and set the delay of the transmitter 1010a. Additionally or alternatively, in some embodiments, time of flight determination can be carried out using other signals such as radio frequency signals or light signals (e.g., a laser pulse). In the slave receiver mode, the transmitter 1010b of the second radar is not active, and thus can be disabled or removed.

The details of trigger and delay generation and associated operations were previously described and are only briefly described in connection with FIG. 10. For example, the embedded system 1004a of the first equivalent time sampling system 1002a generates and sends a trigger pulse to the delay circuit for the transmitter and the receiver. The delay of the master transmitter 1010a is set to the time of flight to the farthest equivalent time sampling system. And, the delay of the receiver 1008a is set to time of flight to the farthest equivalent time sampling system added to a delay starting with zero seconds and incrementing by, for example, 35 ps. The embedded system 1004b of the second equivalent time sampling system 1002b receives an interrupt from a sensor 1012b and sets the select of the multiplexer 1006b to receive remote triggers from the sensor 1012b. The delay of the receiver 1008 is the time of flight to the first equivalent time sampling system 1002a of the master transmitter subtracted from the time of flight to the farthest equivalent time sampling system and added to a delay starting with zero seconds and incrementing by, for example, 35 ps. A counter in both the first and second equivalent time sampling systems is incremented until 766 samples have been captured. Until the counter reaches 766 samples, a trigger is generated every time the counter increments. The trigger signal also facilitates the capturing of the digital signal from an ADC (not shown) on the first and second equivalent time sampling systems.

In some embodiments, a computer program (also known as a program, software, software application, script, or code) can be written in any form of programming language, including compiled or interpreted languages, and it can be deployed in any form, including as a stand alone program or as a module, component, subroutine, or other unit suitable for use in a computing environment to carry out at least some of the disclosed operations. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be stored on a tangible and non-transitory computer readable medium and deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:
1. An equivalent time sampling system for capturing digital samples of an input signal without reliance on a reference clock signal, comprising:
an embedded system including a processor and a memory having instructions stored thereupon to generate a first trigger pulse and a second trigger pulse;

a transmitter coupled to the embedded system to receive the first trigger pulse and to trigger transmission of an electromagnetic wave to a target;

a receiver coupled to the embedded system and configured to receive a time delayed trigger pulse generated at least in-part based on the second trigger pulse and a particular time delay value, the receiver further configured to receive a reflected signal from the target;

a delay circuit including a programmable time delay coupled to the embedded system and to the receiver, the delay circuit configured to impart the particular time delay value to the second trigger pulse and to output the time delayed trigger pulse to the receiver based on the programmable time delay;

wherein the instructions stored upon the memory of the embedded system, upon execution by the processor, configure the embedded system to:

set a counter to a value indicative of a current number of captured digital signals associated with the signal reflected from the target;

upon a determination that the value is not equal to a terminal value, (a) generate the first trigger pulse without relying on any clock signal;

(b) generate the second trigger pulse without relying on any clock signal;

(c) receive a digital signal representative of the signal reflected from the target;

(d) increment the programmable time delay to a new time delay value;

(e) adjust the counter value using a predetermined adjustment value; and repeat operations (a) to (e) if the adjusted counter value is not equal to the terminal value.

2. The equivalent time sampling system of claim 1, wherein the programmable time delay is incremented by adding a predetermined time delay value to a previous programmable time delay.

3. The equivalent time sampling system of claim 2, wherein the predetermined time delay value is 40 picoseconds.

4. The equivalent time sampling system of claim 1, wherein the digital signal is captured on a falling edge of the time delayed trigger pulse received by the receiver.

5. The equivalent time sampling system of claim 1, wherein the instructions upon execution by the processor further configures the embedded system to:

store the digital signal.

6. The equivalent time sampling system of claim 1, wherein the counter value is adjusted by adding the predetermined adjustment value to a previous counter value.

7. A sampling system for capturing digital samples of an input signal without reliance on a reference clock signal, comprising:

a plurality of equivalent time sampling systems including a first equivalent time sampling system that comprises:

an embedded system including a processor and a memory having instructions stored thereupon to generate a first pulse and a second pulse;

a transmitter coupled to the embedded system to receive a first time delayed trigger pulse generated at least in-part based on the first pulse and a first time delay value and to trigger transmission of an electromagnetic wave to a target;

a first delay circuit including a first programmable time delay coupled to the embedded system and to the transmitter, the first delay circuit configured to impart the first time delay value to the first pulse and to output the first time delayed trigger pulse to the transmitter based on the first programmable time delay;

a receiver coupled to the embedded system and configured to receive a second time delayed trigger pulse generated at least in-part based on the second pulse and a second time delay value, the receiver further configured to receive a reflected signal from the target;

a second delay circuit including a second programmable time delay coupled to the embedded system and to the receiver, the second delay circuit configured to impart the second time delay value to the second pulse and to output the second time delayed trigger pulse to the receiver based on the second programmable time delay;

wherein the instructions stored upon the memory of the embedded system, upon execution by the processor, configure the embedded system to:

set the first programmable time delay to a transmit delay value;

set the second programmable time delay to a receive delay value;

set a counter to a value indicative of a current number of captured digital signals associated with the signal reflected from the target;

upon determination that the value is not equal to a terminal value, (a) generate the first pulse without relying on any clock signal;

(b) generate the second pulse without relying on any clock signal;

(c) receive a digital signal representative of the signal reflected from the target;

(d) increment the second programmable time delay to a new time delay value;

(e) adjust the counter value using a predetermined adjustment value; and repeat operations (a) to (e) if the adjusted counter value is not equal to the terminal value.

8. The sampling system of claim 7, wherein the plurality of equivalent time sampling systems includes a second equivalent time sampling system located further from the first equivalent time sampling system than any other equivalent time sampling system located from the first equivalent time sampling system.

9. The sampling system of claim 8, wherein the transmit delay value is a time of flight from the first equivalent time sampling system to the second equivalent time sampling system.

10. The sampling system of claim 8, wherein the receive delay value is a time of flight from the first equivalent time sampling system to the second equivalent time sampling system.

11. The sampling system of claim 8, wherein the first equivalent time sampling system comprises:

a location determination system to determine the time of flight from the first equivalent time sampling system to the second equivalent time sampling system.

12. The sampling system of claim 11, wherein the location determination system is an ultrasonic beacon system.

13. The sampling system of claim 11, wherein the location determination system is a differential global positioning system (DGPS).

14. The sampling system of claim 7, wherein the second programmable time delay is incremented by adding a predetermined time delay value to a previous second programmable time delay.

15. The sampling system of claim 14, wherein the predetermined time delay value is 40 picoseconds.

16. The sampling system of claim 7, further comprising:
a multiplexer operable to select the second pulse received from the embedded system to output to the second delay circuit, wherein the multiplexer includes
a first input electrically coupled to the embedded system to receive the second pulse from the embedded system,
a second input electrically coupled to a sensor to optionally receive the second pulse from the sensor,
a select input electrically coupled to the embedded system, and
an output electrically coupled to the second delay circuit.

17. The sampling system of claim 7, wherein the digital signal is captured on a falling edge of the second time delayed trigger pulse received by the receiver.

18. The sampling of claim 7, wherein the instructions upon execution by the processor further configures the embedded system to:
store the digital signal.

19. The sampling system of claim 7, wherein the counter value is adjusted by adding the predetermined adjustment value to a previous counter value.

20. A sampling system for capturing digital samples of an input signal without reliance on a reference clock signal, comprising:
a plurality of equivalent time sampling system comprising a first equivalent time sampling system, a second equivalent time sampling system, and a third equivalent time sampling system, wherein
the first equivalent time sampling system comprises a transmitter to trigger transmission of an electromagnetic wave to a target,
the second equivalent time sampling system and third equivalent time sampling system comprise receivers to receive a reflected signal from the target,
the second equivalent time sampling system is located further from the first equivalent time sampling system than the third equivalent time sampling system,
the third equivalent time sampling system comprises:
an embedded system including a processor and a memory having instructions stored thereupon to select a particular source for a pulse that causes acquisition of data samples;
a receiver coupled to the embedded system and configured to receive a time delayed trigger pulse generated at least in-part based on the pulse and a particular time delay value, the receiver further configured to receive the reflected signal from the target;
a delay circuit including a programmable time delay coupled to the embedded system and the receiver, the delay circuit configured to impart the particular time delay value to the pulse and to output the time delayed trigger pulse to the receiver based on the programmable time delay;
a sensor configured to receive a trigger signal generated by the first equivalent time sampling system without relying on any clock signal, and in response generate an indication to the embedded system to select an output signal of the sensor as the source of the pulse;
wherein, upon receiving the indication from the sensor, the instructions stored upon the memory of the embedded system, upon execution by the processor configure the embedded system to:
set the programmable time delay to a receive delay value;
set a counter to a value indicative of a current number of captured digital signals associated with the signal reflected from the target;
upon determination that the value is not equal to a terminal value,
(a) receive a digital signal representative of the signal reflected from the target;
(b) increment the programmable time delay to a new delay value;
(c) adjust the counter value using a predetermined adjustment value; and
repeat operations (a) to (c) if the adjusted counter value is not equal to the terminal value.

21. The sampling system of claim 20, wherein the receive delay value is a time of flight from the first equivalent time sampling system to the third equivalent time sampling system subtracted from a time of flight from the first equivalent time sampling system to the second equivalent time sampling system.

22. The sampling system of claim 20, wherein the programmable time delay is incremented by adding a predetermined time delay value to a previous programmable time delay.

23. The sampling system of claim 22, wherein the predetermined time delay value is 40 picoseconds.

24. The sampling system of claim 20, wherein the third equivalent time sampling system comprises:
a location determination system to determine the time of flight from the first equivalent time sampling system to the third equivalent time sampling system and the time of flight from the first equivalent time sampling system to the second equivalent time sampling system.

25. The sampling system of claim 24, wherein the location determination system is an ultrasonic beacon system.

26. The sampling system of claim 24, wherein the location determination system is a differential global positioning system (DGPS).

27. The sampling system of claim 20, further comprising:
a multiplexer operable to select the pulse received from the sensor to output to the delay circuit, wherein the multiplexer includes
a first input electrically coupled to the embedded system to optionally receive the pulse from the embedded system,
a second input electrically coupled to the sensor to receive the pulse from the sensor,
a select input electrically coupled to the embedded system, and
an output electrically coupled to the delay circuit.

28. The sampling system of claim 20, wherein the sensor includes a photoelectric cell.

29. The sampling system of claim 20, wherein the sensor includes a wireless receiver.

30. The sampling system of claim 20, wherein the digital signal is captured on a falling edge of the time delayed trigger pulse received by the receiver.

31. The sampling of claim 20, wherein the instructions upon execution by the processor further configures the embedded system to:

store the digital signal.

32. The sampling system of claim 20, wherein the counter value is adjusted by adding the predetermined adjustment value to a previous counter value.

\* \* \* \* \*